United States Patent
Dean et al.

(10) Patent No.: US 6,275,968 B1
(45) Date of Patent: *Aug. 14, 2001

(54) APPARATUS AND METHOD TO REDUCE NODE TOGGLING IN SEMICONDUCTOR DEVICES

(75) Inventors: Alvar A. Dean; Kenneth J. Goodnow, both of Essex Junction; Sebastian T. Ventrone, South Burlington, all of VT (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/129,921

(22) Filed: Aug. 6, 1998

(51) Int. Cl.⁷ .................................................. G06F 17/50
(52) U.S. Cl. ................................... 716/2; 716/7; 716/18; 716/4
(58) Field of Search ................................ 326/93, 95, 94, 326/98; 327/172, 173, 174, 176; 716/1–21

(56) References Cited

U.S. PATENT DOCUMENTS

| | | | |
|---|---|---|---|
| 4,569,032 | * 2/1986 | Lee | 208/710 |
| 5,123,107 | * 6/1992 | Mensch, Jr. | 716/7 |
| 5,422,585 | * 6/1995 | Chiangi et al. | 327/170 |
| 5,557,620 | 9/1996 | Miller, Jr. et al. | 714/733 |
| 5,670,899 | * 9/1997 | Kohdaka | 326/97 |
| 5,682,320 | * 10/1997 | Khouja et al. | 716/4 |
| 5,696,694 | * 12/1997 | Khouja et al. | 716/5 |
| 6,038,381 | * 3/2000 | Munch et al. | 716/1 |
| 6,148,434 | * 11/2000 | Nozuyama | 716/6 |
| 6,173,435 | * 1/2001 | Dupenloup | 716/18 |

OTHER PUBLICATIONS

Lang et al. ("Individual flip–flops with gated clocks for low power datapaths", IEEE Transactions on Circuits and Systems II: Analog and Digital Signal Processing, vol. 44, No. 6, Jun. 1997, pp. 507–516).*

Monteiro et al. ("Finite state machine decomposition for low power", 1998 Proceedings of Design Automation Conference, Jun. 15, 1998, pp. 758–763).*

Nogawa et al. ("A data–transition look–ahead DFF circuit for statistical reduction in power consumption", IEEE Journal of Solid–State Circuits, Jun. 13, 1997, vol. 33, No. 5, pp. 702–706).*

Moneiro et al. ("Sequential logic optimization for low power using input–disabling precomputation architectures", IEEE Transactions on Computer–Aided Design of Integrated Circuits and Systems, vol. 17, No. 3, Mar. 1998, pp. 279–284).*

Oh et al. ("Power reduction in microprocessor chips by gated clock routing", 1998 Proceedings of the ASP–DAC '98, Asian and South Pacific Design Automation Conference, Feb. 10, 1998, pp. 313–318).*

Surti et al. ("Low power FSM design using Huffman–style encoding", Proceedings of European Design and Test Conference, 1997, ED&TC '97, Mar. 1997, pp. 521–525).*

(List continued on next page.)

Primary Examiner—Matthew Smith
Assistant Examiner—Phallaka Kik
(74) Attorney, Agent, or Firm—Schmeiser, Olsen & Watts; Eugene I. Shkurko

(57) ABSTRACT

According to the preferred embodiment, a device and method for reducing power consumption by reducing unneeded node toggling is provided. The preferred embodiment reduces unneeded toggling that commonly occurs in many types of logic circuits. The preferred embodiment reduces unneeded node toggling in a circuit by holding a portion of the device at the previous output until the all the inputs have stabilized to their final value during each clock cycle. This reduces power consumption in the device that would normally occur due to unnecessary node toggling.

10 Claims, 7 Drawing Sheets

OTHER PUBLICATIONS

Monteiro et al. ("Optimization of combinational and sequential logic circuits for low power using precomputation", Proceedings of Sixteenth Conference on Advanced Research in VLSI, 1995, Mar. 27, 1995, pp. 430–444).*

Richard Goering, New Tool Makes Power Consumption Top Concern, Electronic Engineering Times, Apr. 1, 1996, p. 1.

G. Holt and A. Tyagi, Minimizing Interconnect Energy Through Integrated Low–Power Placement and Combinational Logic Synthesis, Proceedings of the International Symposium on Physical Design 1997. ACM, New York, pp. 48–53.

* cited by examiner

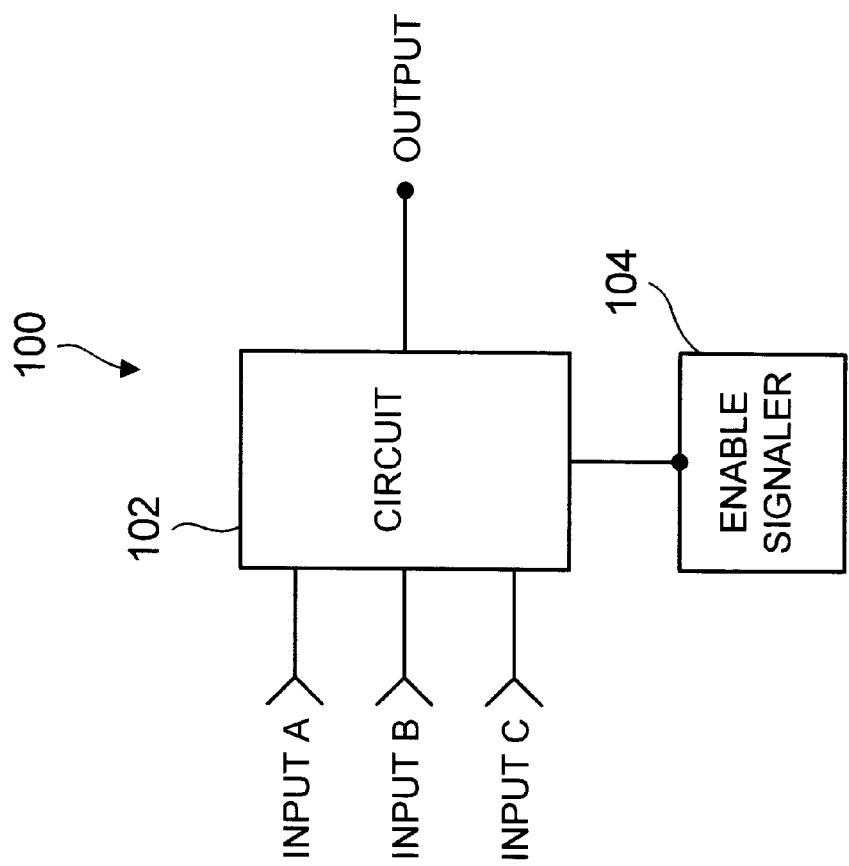

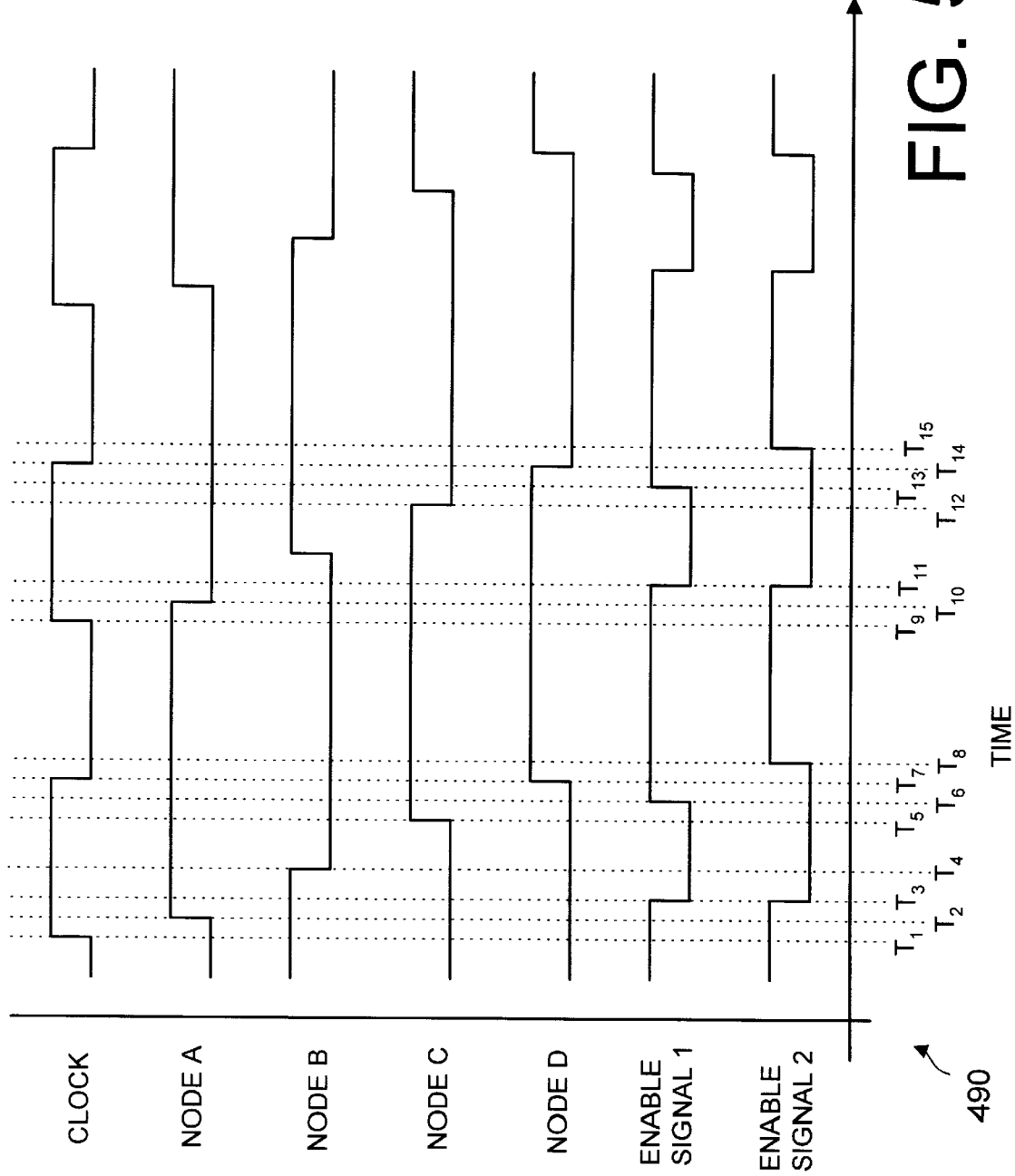

APPARATUS AND METHOD TO REDUCE NODE TOGGLING IN SEMICONDUCTOR DEVICES

BACKGROUND OF THE INVENTION

1. Technical Field

This invention generally relates to semiconductor devices, and more specifically relates to power conservation in semiconductor devices.

2. Background Art

The proliferation of electronics in our modern world is in large part due to integrated circuit semiconductor devices. Integrated semiconductor devices are designed and used in almost every electronic device today. In many applications power consumption is a critical issue for several reasons. For example, in portable devices such as wireless telephones, battery life and battery size is a primary design concern. Consumers want the portable electronic device to run as long as possible using a single battery charge and also want the device, including the battery to be as small and portable as possible. Thus, it is strongly desirable to be able to decrease power consumption of the device such that battery life can be extended and/or the size of the battery decreased.

In other applications power consumption is critical because it is directly related to the amount of heat generated by a device. A semiconductor device that consumes more power will generate more heat. In applications where heat sensitivity is a critical factor, reducing the power consumption reduces the heat generated by the device.

One factor that leads to excessive power consumption is unnecessary node toggling. In CMOS circuits, the power consumed is directly proportional to the size of the capacitive load being switched, and to the frequency with which it is being switched. In a typical random logic network, a given logic circuit output might switch many times in a single clock cycle before settling down on its final value. This phenomenon is due to the fact that in a multi-input circuit, input signals can arrive at different times due to different path delays and load conditions. Each time an input signal arrives, it can cause a switch on the output, causing unnecessary multiple switches each cycle that increase active power yet have no redemptive value since they have no effect on the final logic state.

Turning now to FIGS. 9–10, an exemplary logic gate 900 is illustrated in FIG. 9, and a timing chart 910 for the logic gate 900 is illustrated in FIG. 10. The logic gate 900 comprises an AND-OR-INVERTOR logic gate, but the problem is equally applicable to any type of logic circuit. The timing chart 910 illustrates how the unnecessary toggling can occur as a result of different inputs arriving at different times during a clock cycle. At the beginning of the clock cycle, at time $T_1$, the logic circuit starts out with a low output. Partially into the clock cycle, at time $T_2$, the input B change arrives. This change is propagated through the logic gate 900, and causes the output of the logic gate to toggle. At time $T_3$, input A change arrives, causing the output to toggle a second time. Finally, at time $T_4$, the input C changes, resulting in a third and final toggle. Thus, the output of the logic gate experienced two unnecessary toggles at times $T_2$ and $T_3$ before finally stabilizing at the final output at time $T_4$. These unnecessary toggles, generally called glitches, consume power as they charge and discharge any capacitance connected to the out, without producing useful work.

Therefore, there exists a need to provide reduced power consumption by reducing unnecessary node toggling in semiconductor devices.

DISCLOSURE OF INVENTION

According to the present invention, a device and method for reducing power consumption by reducing unneeded node toggling is provided. The preferred embodiment reduces unneeded node toggling in a circuit by holding portions of the logic circuit at their previous values until all the inputs to the logic circuit have stabilized to their final value. This results in a reduction of the number of unnecessary node toggling that occurs each cycle, reducing power. The present invention also provides a method for designing circuits that efficiently uses the node toggling reduction devices of the present invention.

The foregoing and other features and advantages of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and:

FIG. 1 is a schematic view of a device in accordance with the preferred embodiment;

FIG. 5 is a timing diagram for the enable signaler of FIG. 4;

BEST MODE FOR CARRYING OUT THE INVENTION

Figure 3:
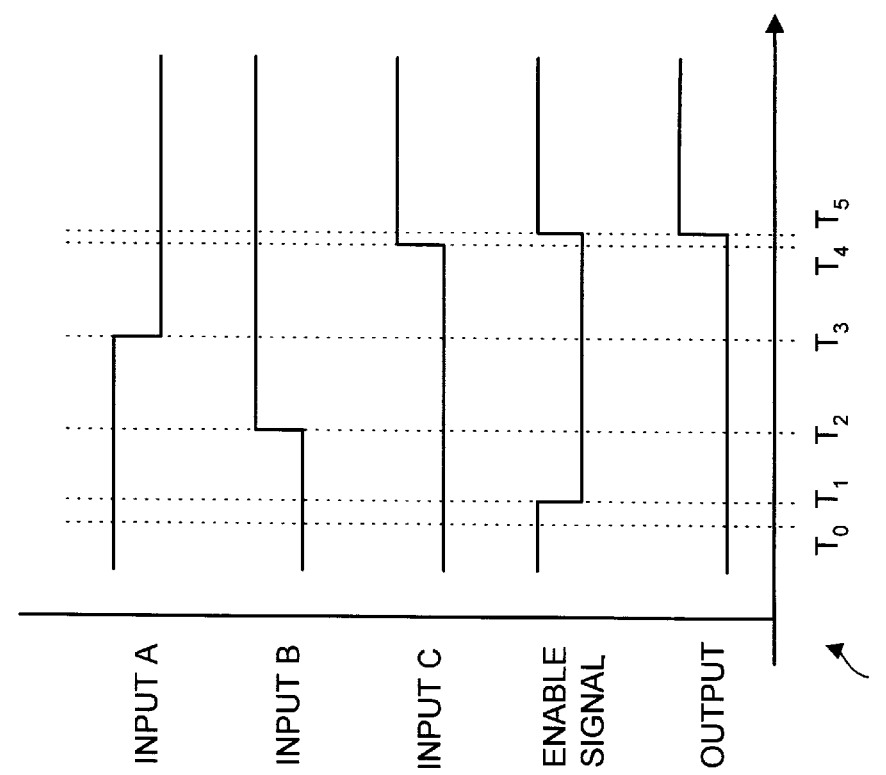
FIG. 3 is a timing diagram for the logic gate of FIG. 2.

The preferred embodiment toggling reduction device reduces power consumption by reducing unneeded node toggling that commonly occurs in many types of logic circuits. The preferred embodiment reduces unneeded node toggling in a circuit by holding a portion of the device at the previous output until the all the inputs have stabilized to their final value during each clock cycle. This reduces power consumption in the device that would normally occur due to unnecessary node toggling.

Turning now to FIG. 1, an exemplary device 100 in accordance with the preferred embodiment is illustrated. Device 100 includes a circuit 102 having a plurality of inputs (A, B and C) and an output. The circuit 100 also includes an enable signaler 104 for controlling the enabling and disabling the circuit 102.

Circuit 102 can comprise any type of circuit in which unnecessary node toggling is to be prevented. Thus, circuit 102 can comprise one or more logic gates commonly used in digital devices. Circuit 102 can also comprise complex devices, such as circuits typically found in integrated devices such as arithmetic logic units (ALU), adders, multiplier, bus multiplexors, barrel shifters, etc. In the case of complex circuits the present invention can be applied at many points in the circuit, from the input stage to the output stage. Thus, in this application, the circuit 100 is defined to include of any of the types of circuits in which unnecessary node toggling can occur. Additional, a minimum toggle circuit is defined as one designed to facilitate disabling and enabling the output in accordance with the preferred embodiment.

In the preferred embodiment, the circuit 102 is enabled and disabled by enable signaler 104. In particular, when the circuit 102 is disabled by enable signaler 104, the output of the circuit 102 is temporarily held at its previous value. When the circuit 102 is enabled by the enable signal 104, the inputs of the circuit 102 are propagated to the output. Thus, by selectively enabling and disabling the circuit 102, excessive node toggling is reduced.

In the preferred embodiment, the circuit 102 is disabled by enable signaler 104 at the beginning of each clock cycle, and is enabled for that clock cycle only after all inputs the circuit 102 have stabilized. By disabling and enabling the circuit 102 during each clock cycle, the false toggles that would normally occur are eliminated. In addition to eliminating the unnecessary toggles of the circuit 102 output, the preferred embodiment also eliminates the toggles of those nets connected to the circuit 102 output. Because a single circuit can feed the inputs of many different elements, this can result in significant power savings.

In the preferred embodiment, the circuit 102 is enabled immediately following the stabilization of its last input. This allows the circuit 102 to provide the correct output as soon as possible while still reducing unnecessary node toggling.

Figure 2:
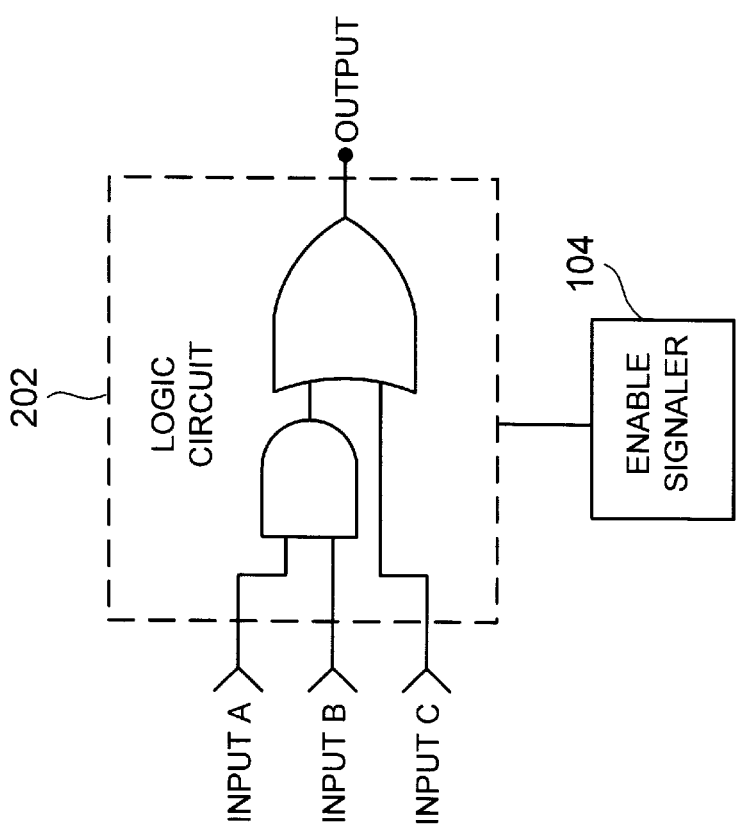
FIG. 2 is a schematic view of a logic gate in accordance with the preferred embodiment.

Turning now to FIGS. 2 and 3, and the operation of an exemplary circuit in accordance with the preferred embodiment is illustrated. In FIG. 2, the exemplary circuit comprises an AND-OR-INVERTER logic gate 202. Again, in accordance with the preferred embodiment a enable signaler 104 is used to reduce unnecessary node toggling. In FIG. 3, a timing chart 310 illustrates the operation of logic gate 202 in the context of the preferred embodiment. The timing chart 310 illustrates how unnecessary node toggling is reduced by disabling the logic gate 202 until all the inputs to the logic gate have stabilized. At the beginning of the clock cycle, at time $T_0$, the logic circuit 202 has an low output. In accordance with the preferred embodiment, the logic circuit 202 is disabled shortly after the start of clock cycle, time $T_1$, by providing a low enable signal. When the logic circuit 202 is disabled, the output of the logic circuit 202 is held at its previous value. Partially into the clock cycle, at time $T_2$, the input B change arrives. In the prior art, this change would be immediately propagated to the output, resulting in an unwanted and unnecessary node toggle. In the preferred embodiment, the output of the logic gate 202 is unchanged as a result of the low enable signal. At time $T_3$, input A change arrives. Again, in the prior art this would result in an unnecessary toggle, but in the preferred embodiment the output again remains unchanged. At time $T_4$, the input C change arrives. In the embodiment illustrated in FIG. 2, this is the last input to arrive. Thus, in the preferred embodiment, the logic circuit 202 is then enabled by activating the enable signal. This occurs at time $T_5$. Ideally, the enable signal should arrive as soon as possible after the last input has stabilized while assuring it does not arrive before. So preferably, $T_5$ occurs on or shortly after $T_4$. With the logic gate enabled, the output of the logic gate 202 switches to its final value. Thus, the preferred embodiment prevents two unnecessary toggles in this example, while providing the correct output with minimal, if any, delay. In this application, the time between when the circuit is disabled (i.e., time $T_1$) and then enabled again (i.e., time $T_5$) will be referred to as the hold time.

Of course, it should be noted that the logic circuit 202 and the timing chart 310 are just exemplary of the type of circuits in which unnecessary node toggling can occur, and one specific example of how inputs could be received. The present invention is equally applicable to other types of circuits, and to other input characteristics.

Figure 4:
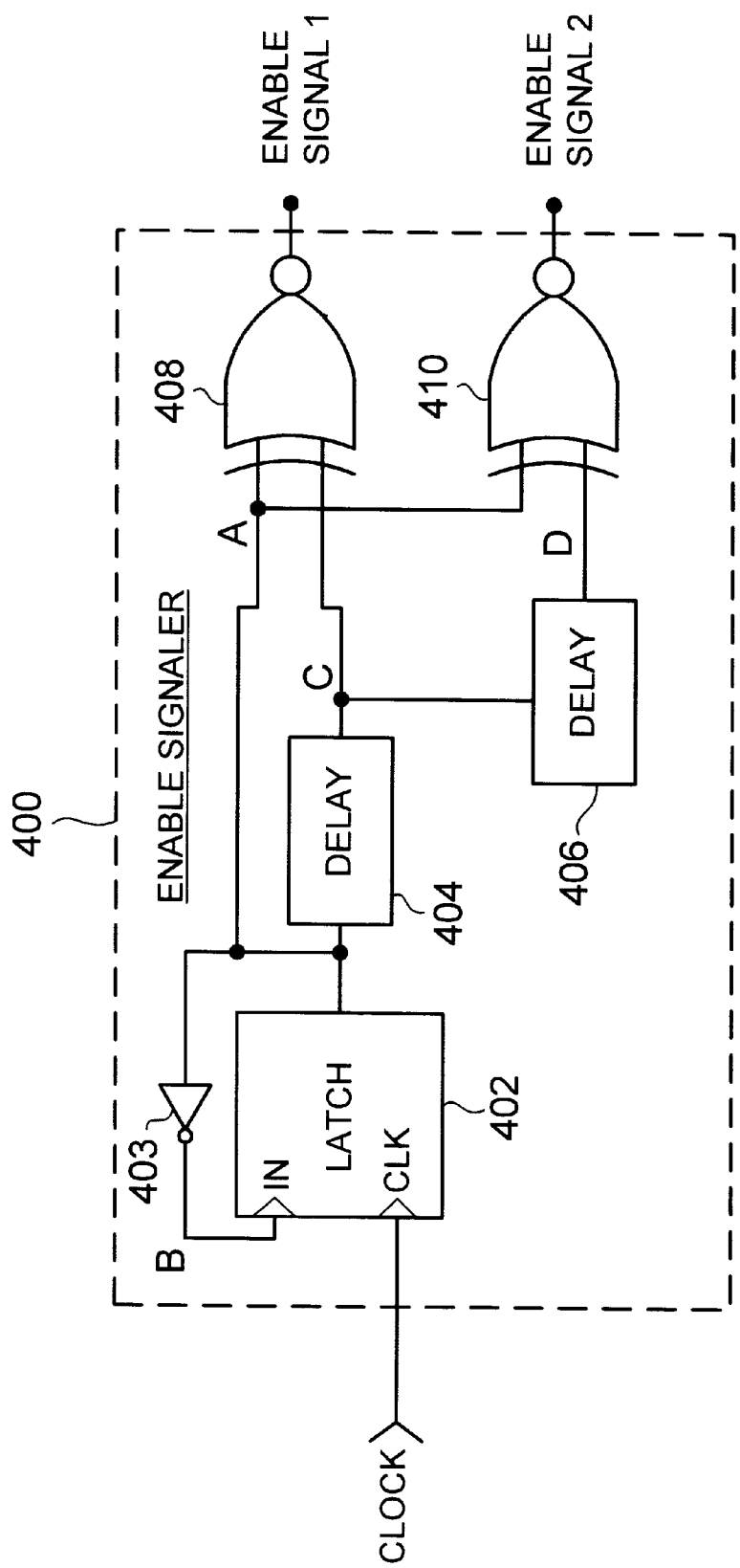
FIG. 4 is a schematic view of a enable signaler in accordance with the preferred embodiment.

Turning now to FIGS. 4–5, an exemplary enable signaler 400 in accordance with the preferred embodiment is illustrated in FIG. 4, and a exemplary timing chart 490 for the enable signaler 400 is illustrated in FIG. 5. The enable signaler 400 is designed to provide two enable signals at two different times during the clock cycle. Of course, outputs from the enable signaler 400 can be added or deleted as needed for a particular application. The enable signaler 400 includes a latch 402, an inverter 403, a delay 404, a delay 406, an exclusive-NOR (XNOR) gate 408, and an XNOR gate 410.

The latch 402 can be any type of latch that will propagate from the input to the output when the clock cycles. The latch 402 receives the clock signal into its clock input. In FIG. 5, the start of the first illustrated clock cycle is time $T_1$. The output of the latch 402 is fed back to its data input through inverter 403. This causes the output of latch 402 to toggle at the beginning of each clock cycle, with a short propagation delay caused by latch 402. Thus, in FIG. 5, the output of latch 402 (Node A) toggles at time $T_2$. The output change of latch 404, which is fed back to the input of latch 402 (Node B) though the inverter 403, will cause the latch 402 to toggle again at the beginning of the next clock cycle.

The output change of latch 402 also propagates to the XNOR gates, where it causes the XNOR gate outputs to go low after a short delay. Thus, in FIG. 5, enable signal 1 and enable signal 2 toggle at time $T_3$. The low output of the XNOR gates serves to disable the circuits which are connected to enable signal 1 and enable signal 2. At the same time, the output of latch 402 starts to propagate through the delays 404 and 406. After a time period approximately equal to that of delay 404, the latch output propagates to the second input of XNOR gate 408. Thus, in FIG. 5, the second input of XNOR gate 408 (Node C) goes high at time $T_5$. At XNOR 408, the delayed signal causes the output of XNOR gate 408 to again go high. Thus, in FIG. 5 the enable signal 1 goes high again at time $T_6$. The enable signal 1 is thus disabling the corresponding circuits from shortly after the start of the clock cycle (i.e., time $T_3$) to a time into the clock cycle approximately equal to that of the delay through latch 402 and delay 404 (i.e., time $T_6$).

The output of delay 404 also propagates through delay 406 to XNOR gate 410. Thus, in FIG. 5, the second input of XNOR gate 410 (Node D) goes high at time $T_7$. At XNOR gate 410, the twice-delayed signal causes the output of XNOR gate 410 to again go high. Thus, in FIG. 5, enable signal 2 goes high again at time $T_8$. Thus, the enable signal 2 is disabling its corresponding circuits from shortly after the start of the clock cycle (i.e., time $T_3$) to a time into the clock cycle approximately equal to that of the delay of latch 402 plus delay 404 plus the delay 406 (i.e., time $T_8$).

The same pattern occurs for each subsequent clock cycle. For example, at the next clock cycle (beginning at time $T_9$), the enable signal 1 is low between times $T_{11}$ and $T_{13}$, and enable signal 2 is low between times $T_{11}$ and $T_{15}$.

Thus, by appropriately selecting delay 404 and delay 406, two enable signals can be provided with two different hold times. Thus, different circuits, or the same circuit in different places can be disabled and enabled using a single signal enabler. Furthermore, additional delays and additional XNOR gates can be used to provide additional enable signals with different hold times.

Figure 7:
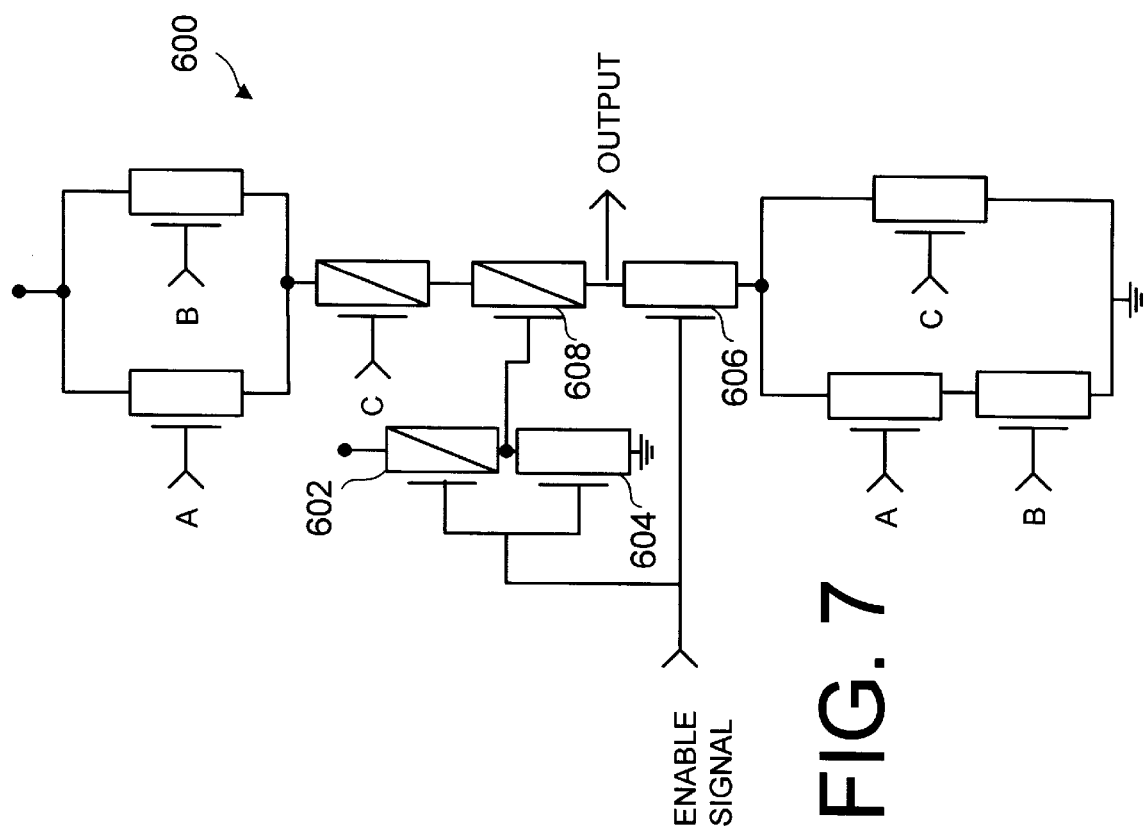
FIG. 7 is a schematic view of an AND-OR-INVERTOR in accordance with the preferred embodiment.
Figure 6:
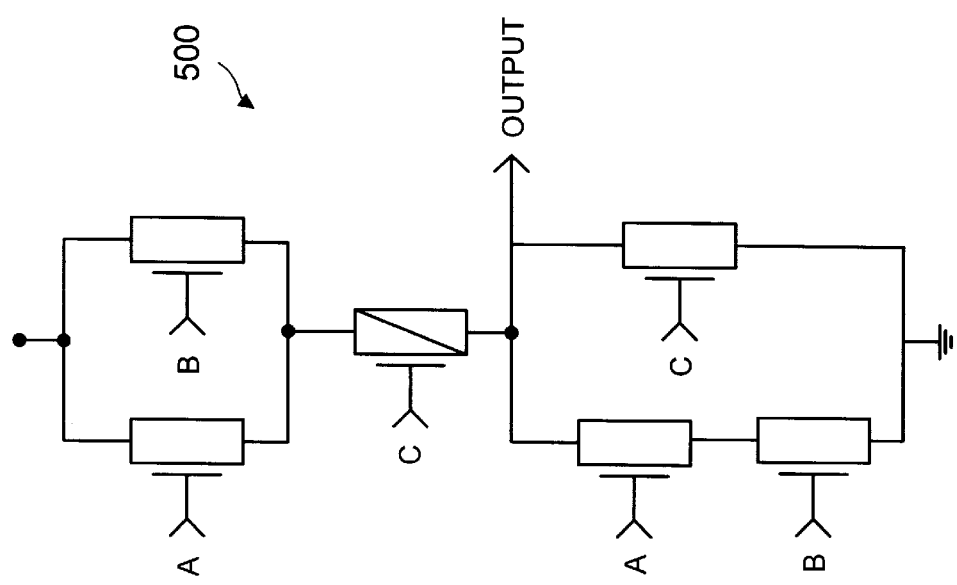
FIG. 6 is a schematic view of an AND-OR-INVERTOR gate.

Turning now to FIG. 6 a prior art implementation of an AND-OR-INVERTER logic gate 500. This shows a typical CMOS implementation of the logic gate. Turning now to FIG. 7, an AND-OR-INVERTOR 600 is shown with modifications for use in the preferred embodiment. In particular, transistors 602, 604, 606, and 608 have been added to facilitate the use of the enable signal to disable/enable the ANDOR-INVERTOR each clock cycle. When the enable signal is low, the output of the AND-OR-INVERTER 600 is tri-stated, holding the output to its previous value. When the enable signal is high, the AND-OR-INVERTER 600 operates as the regular AND-OR-INVERTOR 500 illustrated in FIG. 6. Thus, the preferred embodiment can be easily implemented into existing designs by replacing the AND-OR-INVERTOR 500 with the AND-OR-INVERTER 600 in places where it is expedient to do so. Of course, this is just one example of how one type of logic gate could be implemented for use with the preferred embodiment of the present invention.

Figure 8:
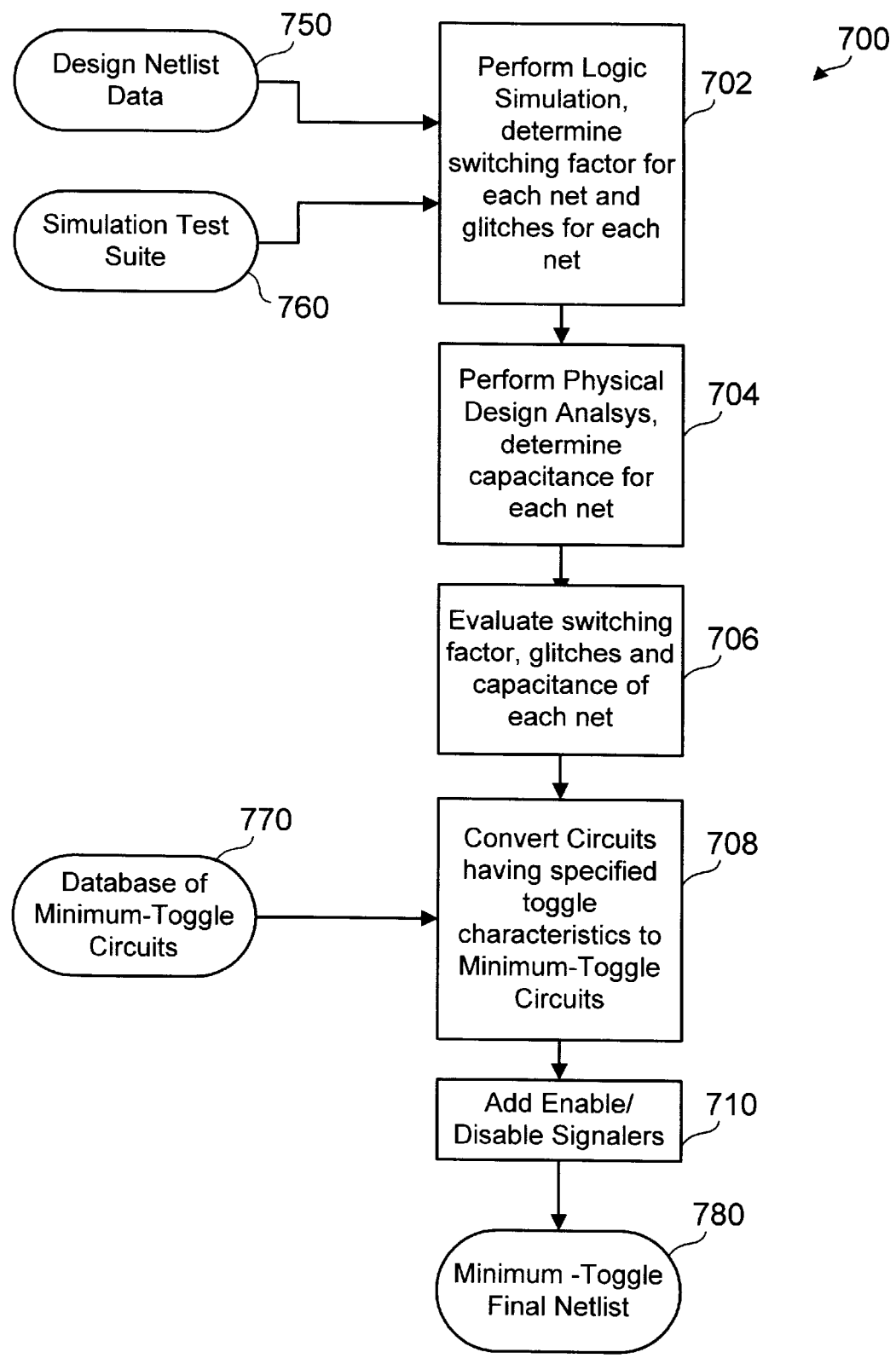
FIG. 8 is a flow diagram of a method for designing devices in accordance with the preferred embodiment.
Figure 10:
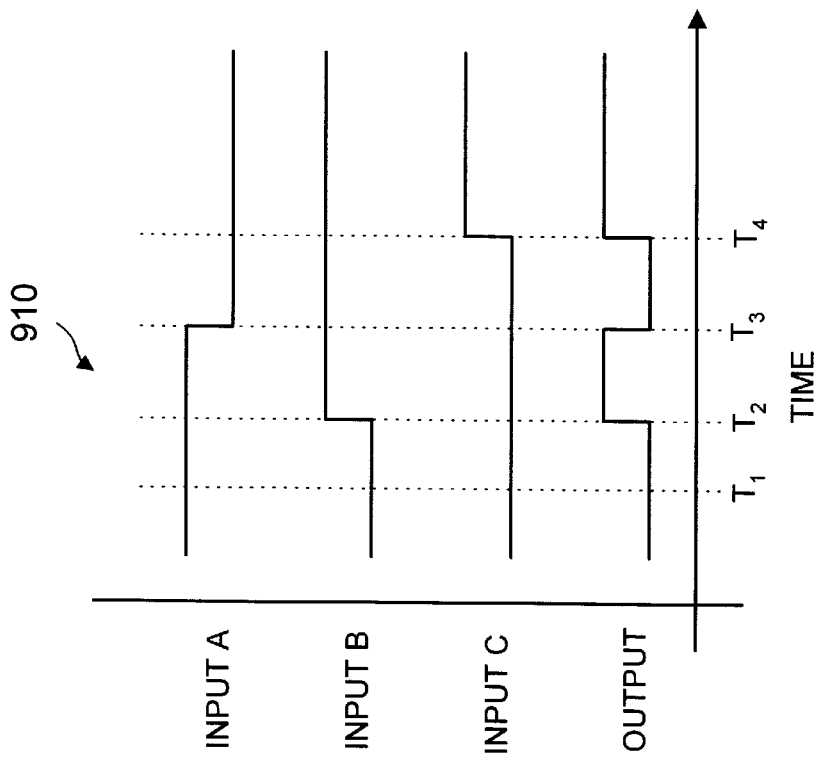
FIG. 10 is a timing diagram for the logic gate of FIG. 9
Figure 9:
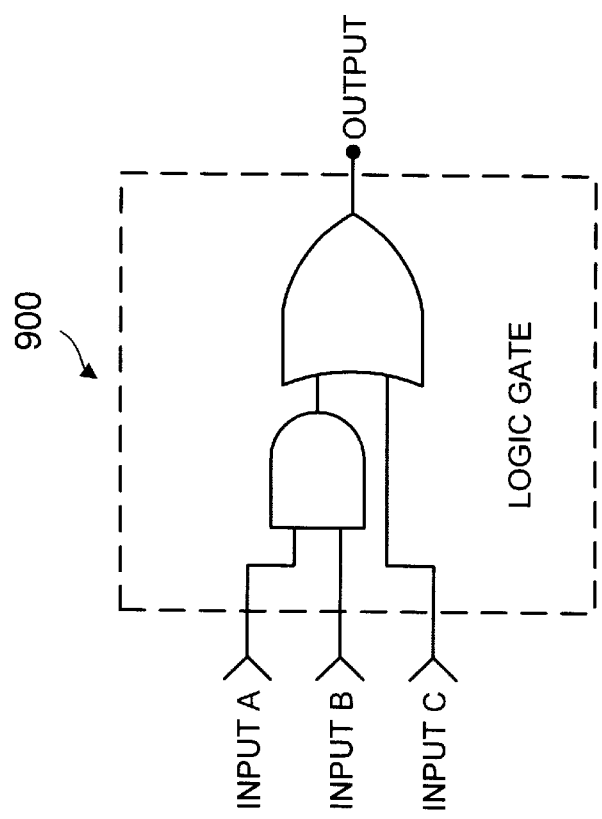
FIG. 9 is a schematic view of a prior art logic gate.

Turning now to FIG. 8, a method 700 for design devices using the preferred embodiment is illustrated. The method results in the selective replacement of circuits in the design with minimum toggle circuits to reduce unwanted node toggling. The method starts out using design netlist data 750 and a simulation test suite 760 to perform a logic simulation in step 702. The design netlist data 750 preferably includes a gate level listing of all the elements in circuit and a listing of how those elements are interconnected. The simulation test suite 760 provides the data needed to perform a simulation of the circuit described by design netlist data 750. Thus, the test suite 760 preferably includes simulation vectors that approximate the typical operation of the device such that the switching factors reflect average operating conditions.

During the simulation of step 702, the switching factor is determined for each net, where the switching factor is proportional to the percentage of clock cycles during which the corresponding net switches. Thus, nets that are actively switching during most clock cycles would have a higher switching factor than nets that only actively switch a small portion of the clock cycles.

It should be noted that if switching factors from the logic simulation are not available, mathematical techniques can be used whereby statistical or probabilistic models can be used to generate switching factors from design netlist data 750. This can be down with tools such as IBM's Power Calc power calculator. This technique, however, is generally not as accurate as simulation.

Also during the simulation of step 704, the glitches per net is determined for each net. The glitches per net is proportional to the number of intermediate and unwanted toggles that occur each clock cycle the net is active. Thus, the glitches per net is proportional to the number of times that different input arrival times causes unwanted toggles. The number of glitches per net can be determined using a program that processes the waveform output generated during step 704 on a net by net basis.

It should be noted that instead of determining the glitches per net by simulation, the value could be estimated using circuit analysis techniques. This approach is not likely to be as accurate as performing the simulation, but it may be acceptable in some circumstances.

With the switching factor and glitches per net determined, the next step 704 is to perform a physical design analysis to determine the capacitance coupled to each net. This would typically involve measuring the capacitance of the net and all downstream logic. This can be done using any known analysis technique, such as tracing the logic network fed by the net using a network tracing program and adding up the capacitances of all the downstream nets. Such network tracing is usually available in schematic editors such as IBM's Wizard Tools and Cadence's Design Framework II. The capacitance attached to each net is an important factor because the power consumed by unwanted toggles is proportional to the capacitance of the attached net. The larger the capacitance, the larger the consumed power.

Preferably, the physical design capacitance is calculated from the final design, after it has been placed and routed with physical design tools such as IBM's Chipbench tool or Cadence's Cell Ensemble. If such physical design capacitances are not available, the capacitance per net can be estimated by using a capacitance load fanout model on the design netlist data 750.

The next step 706 is to evaluate the switching factor, glitches, and capacitance of each net to determine if the corresponding circuit should be replaced with a minimum toggle circuit. In the preferred embodiment this is done by computing an overall effect value for each net. For example, the overall effect can be computed as follows:

$$OE = \alpha S + \beta G + \gamma C \tag{1}$$

where OE is the overall effect, S is the switching factor, G is the glitches per cycle and C is the capacitance, and alpha, beta and gamma are constants used to adjust the relative effect of those factors.

If the overall effect value exceeds a predetermined amount, the corresponding circuit should be replaced with a minimum toggle circuit. If the overall effect value is less than the predetermined amount, the regular circuit is used. The predetermined amount could be determined by a variety of factors, such as the relative need for power efficiency balanced against the need to achieve high density. For example, if the final density of the device is of significant concern, the predetermined value can be set higher to assure that a relatively small number of standard circuits are replaced with relatively larger minimum toggle circuits.

With the nets evaluated, the next step 708 is to replace those circuits having the specified overall effect greater than the predetermined amount with minimum toggle circuits. This step would preferable use a database 770 of minimum toggle circuits that contains a minimum toggle circuit for each of the types of circuits in the design netlist. In the preferred embodiment, those circuits having the largest overall effect are replaced first until all the remaining silicon die is used or until all the circuits having the minimum overall effect have been replaced. At each step in this process, the power consumption an be incrementally re-calculated based upon the new logic network.

The next step 710 is to provide enable signalers as needed to provide enable signals with the appropriate hold time. This is preferably done by using a static timing analysis tool, such as IBM's Einstimer to determine the typical arrival times of all the inputs to the circuit. The enable signalers will then be used to selectively disable and enable the minimum toggle circuits during each clock cycle to minimize unnecessary node toggling.

In the preferred embodiment, the addition of the enable signalers and the conversion from standard circuits to minimum toggle circuits is done with extension language routines available under a logic synthesis program such as IBM's Booledozer. The extension language provides mechanisms for the addition or deletion of circuits as well as the ability to change circuit connections.

With the enable signalers provided, the result is a design netlist 780 that has minimum toggle characteristics, resulting in improved power consumption. Thus, the preferred embodiment of the present invention provides a device and method for reducing power consumption by reducing unneeded node toggling. The preferred embodiment reduces unneeded node toggling in a circuit by holding portions of the logic circuit at their previous values until all the inputs to the logic circuit have stabilized to their final value. This results reducing the number of unnecessary node toggling that occurs each cycle, reducing power.

The preferred embodiment can be used in a wide variety of applications. For example, in a digital signal processor the preferred embodiment can be implemented in the decode logic unit at a natural pinch point, where a handful of nets end up controlling thousands of gates every cycle. In the prior art, many unnecessary toggles occurred at the pinch point, causing excessive node toggling of the downstream logic. By using the preferred embodiment, this node toggling can be significantly reduced.

As another example, the preferred embodiment can be used by incorporating it in an input stage for a multiplier. The preferred embodiment blocks propagation of the input data from going into the multiplier until the data at its inputs is stable. Without this, the multiplier would multiply several times in a cycle as the value at the data input changes. The preferred embodiment can also be used inside the multiplier to further reduce unnecessary toggles, although this power savings is not likely to be as significant.

While the invention has been particularly shown and described with reference to a preferred exemplary embodiment thereof, it will be understood by those skilled in the art that various changes in form and details may be made therein without departing from the spirit and scope of the invention. It will be also understood that, while various of the conductors are shown in the drawing as single lines, they are not so shown in a limiting sense, and may comprise plural conductors, as is understood in the art.

What is claimed is:

1. A method for designing a device comprising a plurality of circuits to reduce power consumption, the method comprising the steps of:

a) selecting at least one circuit from said plurality of circuits to replace with at least one minimum toggle circuit;

b) determining time needed for each input of the at least one minimum circuit toggle circuit to stabilize each clock cycle; and c) providing an enable signaler to disable corresponding output(s) of the at least one minimum toggle circuit each clock cycle and enable corresponding output(s) of the at least one minimum toggle circuit after the determined time needed for all of a plurality of inputs to said minimum toggle circuit have stabilized during each clock cycle.

2. The method of claim 1 wherein the step of selecting at least one of said plurality of circuits comprises determining relative power consumption of said plurality of circuits due to unnecessary node toggling in the plurality of circuits that result from different input arrival times.

3. The method of claim 1 wherein the step of selecting at least one of said plurality of circuits comprises simulating said device and measuring node toggling that results from different input arrival times for each of said plurality of circuits.

4. The method of claim 1 wherein the step of selecting at least one of said plurality of circuits comprises simulating said device and determining a switching factor for each of said plurality of circuits, wherein said switching factor is proportional to percentage of clock cycles in which said plurality of circuits is active.

5. The method of claim 1 wherein the step of selecting at least one of said plurality of circuits comprises determining capacitance of each net connected to each of said plurality of circuits.

6. The method of claim 5 wherein the step of determining capacitance of each net comprises determining capacitance of all downstream logic.

7. The method of claim 1 wherein the step of selecting at least one of said plurality of circuits comprises determining overall effect due to node toggling resulting from different input arrival times by measuring node toggling that results from different input arrival times for each of said plurality of circuits, determining a switching factor for each of said plurality of circuits, wherein said switching factor is proportional to percentage of clock cycles in which said plurality of circuits is active, and determining capacitance of each net connected to each of said plurality of circuits.

8. The method of claim 1 wherein the step of selecting at least one of said plurality of circuits comprises:

i) determining overall effect due to node toggling resulting from different input arrival times for each of said plurality of circuits; and ii) selecting at least one of said plurality of circuits having highest overall effect until available area on device is used.

9. The method of claim 1 wherein the step of determining time needed for each input of the at least one minimum toggle circuit to stabilize each clock cycle comprises performing a static timing analysis that provides arrival times of said each input.

10. The method of claim 1 wherein the step of providing an enable signaler comprises providing an enable signal to enable the output(s) of said at least one minimum toggle circuit after a predetermined hold time after an approximate beginning of each clock cycle and wherein the predetermined hold time is greater than the time needed for all of the plurality of inputs to stabilize.

* * * * *